United States Patent [19]

Kellermann

[11] 3,729,686

[45] Apr. 24, 1973

[54] REGULATING CIRCUIT ARRANGEMENT FOR CONTROLLING THE AMPLIFICATION OF AN AMPLIFIER

[75] Inventor: Konrad-Johann Kellermann, Munich, Germany

[73] Assignee: Siemens Aktiengesellschaft, Berlin and Munich, Germany

[22] Filed: Oct. 29, 1970

[21] Appl. No.: 85,120

[30] Foreign Application Priority Data

Nov. 17, 1969 Germany..........P 19 57 731.2

[52] U.S. Cl.....................................330/29, 330/145

[51] Int. Cl................................................H03g 3/30

[58] Field of Search................................330/29, 145

[56] References Cited

UNITED STATES PATENTS 3,548,332 12/1970 Omura et al................330/29

*Primary Examiner*—Roy Lake

*Assistant Examiner*—James B. Mullins

*Attorney*—Curt M. Avery, Arthur E. Wilfond, Herbert L. Lerner and Daniel J. Tick

[57] ABSTRACT

A voltage divider has a controllable series impedance comprising a series-connected transistor and a controllable quadrature axis impedance comprising a parallel-connected transistor connected in phase opposition to the series-connected transistor. The voltage divider dynamically divides the input voltage of an amplifier and derives therefrom a control voltage for controlling the amplifier.

6 Claims, 1 Drawing Figure

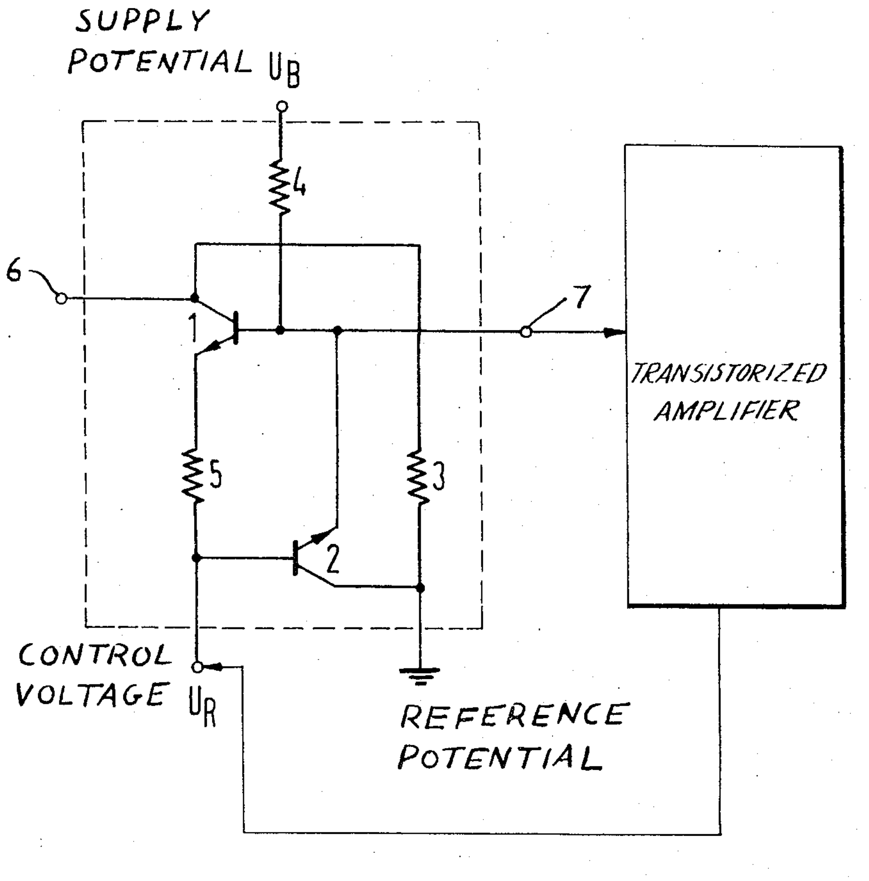
SUPPLY
POTENTIAL $U_B$
4
6
7
1
5
3
2
TRANSISTORIZED
AMPLIFIER
CONTROL
VOLTAGE $U_R$
REFERENCE
POTENTIAL

REGULATING CIRCUIT ARRANGEMENT FOR CONTROLLING THE AMPLIFICATION OF AN AMPLIFIER

DESCRIPTION OF THE INVENTION

The invention relates to an amplifier control circuit. More particularly, the invention relates to a regulating circuit arrangement for controlling the amplification of an amplifier.

The controllability of an amplifier is limited. When large signals are supplied to a transistorized amplifier circuit, which are larger in amplitude than the normal control range, interferences occur in receivers such as, for example, cross-modulation, inter-modulation, linear modulation distortion, non-linear modulation distortion and received sidebands. Difficulties are particularly caused by the aforedescribed factors in regulated transistorized amplifiers which process the received input signals in receiver circuits, regardless of the magnitude of the input signals, and are expected to maintain a constant output signal level.

The regulation or control of an amplifier may be provided by working point regulation in the form of downward and upward regulation, by feedback coupling regulation or by potential regulation with the assistance of a dynamic voltage divider connected at the input of the amplifier.

The circuit arrangement of the invention regulates or controls the amplification of an amplifier with the assistance of a voltage divider comprising controllable impedances. The voltage divider dynamically divides the input voltage of the amplifier and derives therefrom a control or regulating voltage for controlling the amplifier. The control voltage is provided by the amplifier to be regulated.

The principal object of the invention is to provide a new and improved regulating circuit arrangement for controlling the amplification of an amplifier.

An object of the invention is to provide a regulating circuit arrangement for controlling the amplification of an amplifier to process larger input signals without distortion in the amplifier.

An object of the invention is to provide a regulating circuit arrangement for controlling the amplification of a transistorized amplifier to process the largest possible input signals without distortion in the amplifier.

An object of the invention is to provide a regulating circuit arrangement for controlling the amplification of a transistorized amplifier in a manner whereby the conductivity damping or attenuation of the regulating circuit is zero in the unregulated condition.

An object of the invention is to provide a regulating circuit arrangement of simple structure for controlling the amplification of an amplifier to permit the amplification of maximum amplitude input signals.

An object of the invention is to provide a regulating circuit arrangement for controlling the amplification of an amplifier with efficiency, effectiveness and reliability.

In accordance with the invention a regulating circuit arrangement for controlling the amplification of an amplifier comprises voltage dividing means having controllable impedances for dynamically dividing the input voltage of an amplifier and deriving therefrom a control voltage for controlling the amplifier. The voltage dividing means comprises a controllable series impedance comprising a series connected transistor having emitter, collector and base electrodes and a controllable quadrature axis impedance comprising a parallel-connected transistor controlled in phase opposition to the series-connected transistor. The parallel-connected transistor has emitter, collector and base electrodes. An input terminal is connected to the collector electrode of the series-connected transistor. A source of reference potential is connected to the collector electrode of the parallel-connected transistor and is connected to the collector electrode of the series-connected transistor via a first ohmic resistor. An output terminal is connected to the base electrode of the series-connected transistor. A source of supply potential is connected to the base electrode of the series connected transistor via a second ohmic resistor. The base electrode of the series-connected transistor is connected to the emitter electrode of the parallel-connected transistor. A source of control voltage is connected to the base electrode of the parallel-connected transistor and is connected to the emitter electrode of the series-connected transistor via a third ohmic resistor.

The amplifier regulated by the regulating circuit arrangement of the invention is a transistorized amplifier. The series-connected transistor and the parallel-connected transistor are of the same conductivity type. The source of control voltage is in the amplifier.

The regulating circuit arrangement of the invention is a DC coupled, integratable voltage divider, which is doubly controlled. The series impedance and the quadrature axis impedance are controlled by the same control voltage, but in phase opposition. In relation to a simple control, this provides a considerable increase in the control volume. A particular advantage of the regulating circuit arrangement of the invention is that the transistors, whether or not they are integrated, are not operated in the active range, so that they do not act as noise sources.

In order that the invention may be readily carried into effect, it will now be described with reference to the accompanying drawing, wherein the single FIGURE is a circuit diagram of an embodiment of the regulating circuit arrangement of the invention.

The regulating circuit arrangement of the FIGURE comprises a voltage divider having a series impedance and a quadrature axis impedance. The series impedance is controllable and comprises a series-connected transistor 1. The quadrature axis impedance is controllable and comprises a parallel-connected transistor 2.

An input terminal 6 is connected directly to the collector electrode of the transistor 1. A source of reference potential such as, for example, ground potential, is connected to the collector electrode of the transistor 1 via a first ohmic resistor 3. An output terminal 7 is directly connected to the base electrode of the transistor 1 and to the emitter electrode of the transistor 2. The transistorized amplifier controlled or regulated by the regulating circuit of the FIGURE is connected to the output terminal 7.

A source of supply potential $U_B$ is connected to the base electrode of the transistor 1 via a second ohmic resistor 4. The electrode of the transistor 2 is directly connected to the source of reference potential and therefore has the reference potential. A source of control voltage $U_R$ is directly connected to the base electrode of the transistor 2 and is connected to the emitter electrode of the transistor 1 via a third ohmic resistor 5.

The source of control voltage $U_R$ is preferably in the amplifier which is controlled by the regulating circuit arrangement of the FIGURE. The transistors 1 and 2 are of NPN conductivity type.

The regulating circuit arrangement of the invention may be regarded as a passive control component which is connected in the input of an amplifier to be controlled or regulated. The input signal is applied to the input terminal 6 and is therefore applied between said input terminal and the reference potential. The output signal or control or regulating signal is provided at the output terminal 7 and is therefore provided between said output terminal and the reference potential. In the unregulated condition, the transistor 1 is in its conductive condition and the transistor 2 is in its non-conductive condition. The input signal supplied to the input terminal 6 is then transferred directly to the output terminal 7.

During the regulation or control operation, the ohmic resistance of the transistor 1 initially becomes high and the ohmic resistance of the transistor 2 becomes low. This results in a voltage division between the input terminal 6 and the output terminal 7, dependent upon the control voltage $U_R$.

The input signals processed in the regulating circuit arrangement of the invention may have very high amplitudes or magnitudes. This does not produce the aforedescribed interferences. The amplitudes of the input signals are higher than in any amplifiers utilized with electronic tubes. The potential or voltage control provided by the regulating circuit arrangement of the invention is superior to any other transistor regulation or control with regard to the controllability achieved.

While the invention has been described by means of a specific example and in a specific embodiment, I do not wish to be limited thereto, for obvious modifications will occur to those skilled in the art without departing from the spirit and scope of the invention.

I claim:

1. A regulating circuit arrangement for controlling the amplification of an amplifier, comprising voltage dividing means having controllable impedances for dynamically dividing the input voltage of an amplifier and deriving therefrom a control voltage for controlling the amplifier, said voltage dividing means comprising a controllable series impedance comprising a series-connected transistor having emitter, collector and base electrodes and a controllable quadrature axis impedance comprising a parallel-connected transistor controlled in phase opposition to the series-connected transistor, said parallel-connected transistor having emitter, collector and base electrodes, an input terminal connected to the collector electrode of the series-connected transistor, a first ohmic resistor, a source of reference potential connected to the collector electrode of the parallel-connected transistor and is connected to the collector electrode of the series-connected transistor via the first resistor, an output terminal connected to the base electrode of the series-connected transistor, a second ohmic resistor, a source of supply potential connected to the base electrode of the series-connected transistor via the second resistor, conductive means connecting the base electrode of the series-connected transistor to the emitter electrode of the parallel-connected transistor, a third ohmic resistor, a source of control voltage connected to the base electrode of the parallel-connected transistor and is connected to the emitter electrode of the series-connected transistor via the third resistor.

2. A regulating circuit arrangement as claimed in claim 1, wherein the amplification of a transistorized amplifier is controlled.

3. A regulating circuit arrangement as claimed in claim 1, wherein the series-connected transistor and the parallel-connected transistor are of the same conductivity type.

4. A regulating circuit arrangement as claimed in claim 1, wherein the source of control voltage is in the amplifier.

5. A regulating circuit arrangement as claimed in claim 1, wherein the amplification of a transistorized amplifier is controlled, the series-connected transistor and the parallel-connected transistor are of the same conductivity type, and the source of control voltage is in the amplifier.

6. A regulating circuit arrangement as claimed in claim 1, which is realized as an integrated circuit.

* * * * *